US008790521B2

(12) United States Patent  (10) Patent No.: US 8,790,521 B2
McConnell et al.  (45) Date of Patent: Jul. 29, 2014

(54) COMBINATION, METHOD, AND COMPOSITION FOR CHEMICAL MECHANICAL PLANARIZATION OF A TUNGSTEN-CONTAINING SUBSTRATE

(71) Applicant: Air Products and Chemicals, Inc., Allentown, PA (US)

(72) Inventors: Rachel Dianne McConnell, Scottsdale, AZ (US); Ann Marie Hurst, Chandler, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 13/930,273

(22) Filed: Jun. 28, 2013

(65) Prior Publication Data

US 2013/0288479 A1  Oct. 31, 2013

Related U.S. Application Data

(62) Division of application No. 12/630,304, filed on Dec. 3, 2009, now Pat. No. 8,506,831.

(60) Provisional application No. 61/140,216, filed on Dec. 23, 2008.

(51) Int. Cl.
 *H01L 21/306* (2006.01)
 *C09G 1/02* (2006.01)

(52) U.S. Cl.
 USPC .......... 216/13; 216/38; 216/53; 216/89; 216/100; 216/108; 438/693; 252/79.4

(58) Field of Classification Search
 None
 See application file for complete search history.

(56) References Cited

U.S. PATENT DOCUMENTS

| | | | |
|---|---|---|---|
| 4,789,648 A | 12/1988 | Chow et al. | |
| 5,276,180 A | 1/1994 | Levenson | |
| 5,993,686 A | 11/1999 | Streinz et al. | |
| 6,117,783 A | 9/2000 | Small et al. | |
| 6,232,228 B1 | 5/2001 | Kwag et al. | |
| 6,313,039 B1 | 11/2001 | Small et al. | |
| 6,436,809 B1 | 8/2002 | Kwag et al. | |
| 6,635,186 B1 | 10/2003 | Small et al. | |
| 6,790,678 B2 | 9/2004 | Song et al. | |
| 6,864,177 B2 | 3/2005 | Jung et al. | |
| 7,022,255 B2 | 4/2006 | Siddiqui et al. | |
| 7,033,942 B2 | 4/2006 | Small et al. | |
| 7,101,800 B2 | 9/2006 | Her et al. | |
| 7,132,058 B2 | 11/2006 | Thomas et al. | |
| 7,153,335 B2 | 12/2006 | Siddiqui et al. | |
| 7,314,823 B2 | 1/2008 | Small et al. | |
| 7,316,977 B2 | 1/2008 | Siddiqui et al. | |
| 7,476,620 B2 | 1/2009 | Siddiqui et al. | |
| 7,513,920 B2 | 4/2009 | Siddiqui et al. | |
| 7,524,348 B2 | 4/2009 | Handte | |
| 7,678,605 B2 | 3/2010 | Schlueter et al. | |
| 7,691,287 B2 | 4/2010 | Siddiqui et al. | |
| 7,968,465 B2 * | 6/2011 | Small et al. | 438/692 |
| 8,114,775 B2 | 2/2012 | Siddiqui et al. | |
| 8,491,806 B2 * | 7/2013 | Hagan et al. | 216/88 |
| 2002/0111024 A1 | 8/2002 | Small et al. | |
| 2002/0125460 A1 | 9/2002 | Tredinnick | |
| 2003/0114083 A1 | 6/2003 | Jernakoff et al. | |
| 2003/0139050 A1 | 7/2003 | Thomas et al. | |
| 2003/0153184 A1 | 8/2003 | Wang et al. | |
| 2003/0170991 A1 | 9/2003 | Wang et al. | |
| 2004/0025444 A1 | 2/2004 | Small et al. | |
| 2005/0014890 A1 | 1/2005 | Small et al. | |
| 2005/0044803 A1 | 3/2005 | Siddiqui et al. | |
| 2005/0079718 A1 | 4/2005 | Siddiqui et al. | |
| 2005/0079803 A1 | 4/2005 | Siddiqui et al. | |
| 2005/0106898 A1 | 5/2005 | Takayama et al. | |
| 2005/0178742 A1 | 8/2005 | Chelle et al. | |
| 2005/0215183 A1 | 9/2005 | Siddiqui et al. | |
| 2005/0258139 A1 | 11/2005 | Nojo et al. | |
| 2005/0266689 A1 | 12/2005 | Small et al. | |
| 2006/0046490 A1 * | 3/2006 | Banerjee et al. | 438/692 |
| 2006/0097347 A1 | 5/2006 | Feller et al. | |
| 2006/0099817 A1 | 5/2006 | Feller et al. | |
| 2006/0117667 A1 | 6/2006 | Siddiqui et al. | |
| 2006/0234509 A1 | 10/2006 | Small et al. | |
| 2006/0270235 A1 | 11/2006 | Siddiqui et al. | |
| 2007/0054495 A1 | 3/2007 | Compton et al. | |
| 2007/0075042 A1 | 4/2007 | Siddiqui et al. | |
| 2008/0038995 A1 | 2/2008 | Small et al. | |
| 2008/0149591 A1 | 6/2008 | Siddiqui et al. | |
| 2008/0182485 A1 | 7/2008 | Siddiqui et al. | |
| 2008/0230835 A1 | 9/2008 | Shingu et al. | |
| 2009/0057661 A1 | 3/2009 | Siddiqui et al. | |
| 2009/0057834 A1 | 3/2009 | Schlueter et al. | |
| 2009/0250656 A1 | 10/2009 | Siddiqui et al. | |
| 2009/0255903 A1 | 10/2009 | Small et al. | |

(Continued)

FOREIGN PATENT DOCUMENTS

TW   500784 B    9/2002
TW   200300442   6/2003

OTHER PUBLICATIONS

G. B. Shinn, "Chemical-Mechanical Polish," Handbook of Semiconductor Manufacturing Technology, Chapter 15, 2000, pp. 415-460.

*Primary Examiner* — Allan Olsen

(74) *Attorney, Agent, or Firm* — Lina Yang

(57) ABSTRACT

A combination, composition and associated method for chemical mechanical planarization of a tungsten-containing substrate are described herein which afford tunability of tungsten/dielectric selectivity and low selectivity for tungsten removal in relation to dielectric material. Removal rates for both tungsten and dielectric are high and stability of the slurry (e.g., with respect to pH drift over time) is high.

8 Claims, No Drawings

(56) References Cited

U.S. PATENT DOCUMENTS

| | | |
|---|---|---|
| 2009/0261291 A1 | 10/2009 | Banerjee et al. |
| 2009/0308836 A1 | 12/2009 | Siddiqui et al. |
| 2010/0081279 A1 | 4/2010 | Palmer et al. |
| 2010/0216309 A1 | 8/2010 | Minami et al. |

\* cited by examiner

COMBINATION, METHOD, AND COMPOSITION FOR CHEMICAL MECHANICAL PLANARIZATION OF A TUNGSTEN-CONTAINING SUBSTRATE

CROSS REFERENCE TO RELATED APPLICATIONS

The present application is a divisional application of U.S. application Ser. No. 12/630,304 filed Dec. 3, 2009, which claims the benefit of U.S. Provisional Patent Application Ser. No. 61/140,216 filed Dec. 23, 2008.

BACKGROUND OF THE INVENTION

This invention relates generally to the chemical-mechanical planarization (CMP) of tungsten-containing substrates on semiconductor wafers and slurry compositions therefore. In particular, the present invention relates to a CMP slurry composition that is effective for use in tungsten CMP and which is a low tungsten/dielectric selectivity slurry for tungsten CMP that is tunable and that simultaneously affords relatively high removal rates of tungsten and dielectric material during CMP processing. In some embodiments, the slurry has excellent pH stability that is virtually constant over many months This invention is especially useful for tungsten CMP where low selectivity for tungsten to dielectric removal as well as low dishing/plug recess on planarized substrates is desired.

CMP for planarization of semiconductor substrates is now widely known to those skilled in the art and has been described in numerous patents and open literature publications. An introductory reference on CMP is as follows: "Chemical—Mechanical Polish" by G. B. Shinn et al., Chapter 15, pages 415-460, in Handbook of Semiconductor Manufacturing Technology, editors: Y. Nishi and R. Doering, Marcel Dekker, New York City (2000).

In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the rotational movement of the pad relative to the substrate. Polishing is continued in this manner until the desired film on the substrate is removed with the usual objective being to effectively planarize the substrate. Typically metal CMP slurries contain an abrasive material, such as silica or alumina, suspended in an oxidizing, aqueous medium.

There are a large number of materials used in the manufacture of integrated circuits such as a semiconductor wafer. The materials generally fall into three categories—dielectric material, adhesion and/or barrier layers, and conductive layers. The use of the various substrates, e.g., dielectric material such as tetraethylorthosilicate (TEOS), plasma enhanced tetraethylorthosilicate (PETEOS), and low-k dielectric materials; barrier/adhesion layers such as tantalum, titanium, tantalum nitride, and titanium nitride; and conductive layers such as copper, aluminum, tungsten, and noble metals is known in the industry.

Integrated circuits are interconnected through the use of well-known multilevel interconnections. Interconnection structures normally have a first layer of metallization, an interconnection layer, a second level of metallization, and typically third and subsequent levels of metallization. Inter-level dielectric materials such as silicon dioxide and sometimes low-k materials are used to electrically isolate the different levels of metallization in a silicon substrate or well. The electrical connections between different interconnection levels are made through the use of metallized vias and in particular tungsten vias. Methods are known for preparing multiple metallized layers and metallized vias in insulator films. In a similar manner, metal contacts are used to form electrical connections between interconnection levels and devices formed in a well. The metal vias and contacts are generally filled with tungsten and generally employ an adhesion layer such as titanium nitride (TiN) and/or titanium to adhere a metal layer such as a tungsten metal layer to the dielectric material.

In one semiconductor manufacturing process, metallized vias or contacts are formed by a blanket tungsten deposition followed by a CMP step. In a typical process, via holes are etched through the inter-level dielectric (ILD) to interconnection lines or to a semiconductor substrate. Next, a thin adhesion layer such as titanium nitride and/or titanium is generally formed over the ILD and is directed into the etched via hole. Then, a tungsten film is blanket deposited over the adhesion layer and into the via. The deposition is continued until the via hole is filled with tungsten. Finally, the excess tungsten is removed by chemical mechanical polishing (CMP) to form metal vias.

The ratio of the removal rate of a metal (e.g., tungsten) to the removal rate of a dielectric base is called the "selectivity" for removal of the metal in relation to removal of the dielectric during CMP processing of substrates comprised of metal and dielectric material. When CMP slurries with high selectivity for removal of metal in relation to dielectric are used, the metal layers are easily over-polished creating a depression or "dishing" effect in the metalized areas. This feature distortion is unacceptable due to lithographic and other constraints in semiconductor manufacturing.

Another feature distortion that is unsuitable for semiconductor manufacturing is called "erosion." Erosion is the topography difference between a field of dielectric and a dense array of metal vias or trenches. In CMP, the materials in the dense array maybe removed or eroded at a faster rate than the surrounding field of dielectric. This causes a topography difference between the field of dielectric and the dense metal (e.g., copper or tungsten) array.

As industry standards trend toward smaller device features, there is an ever-developing need for CMP slurries that deliver superior planarization of the nanostructures of integrated circuit (IC) chips. Specifically, for 45 nm (nanometer) technology nodes and smaller feature sizes, slurry products must deliver low removal rate selectivity between metal and dielectric, thereby lowering erosion while maintaining sufficient removal rate and defect levels. Furthermore, in the competitive market of CMP consumables, low cost of ownership (CoO), specifically through concentration of CMP slurry, is quickly becoming an industry standard.

A typically used CMP slurry has two actions, a chemical component and a mechanical component. An important consideration in slurry selection is "passive etch rate." The passive etch rate is the rate at which a metal (e.g., copper) is dissolved by the chemical component alone and should be significantly lower than the removal rate when both the chemical component and the mechanical component are involved. A large passive etch rate leads to dishing of the metallic trenches and vias, and thus, preferably, the passive etch rate is less than 10 nanometers per minute.

These are two general types of layers that can be polished. The first layer is ILD, such as silicon oxide and silicon nitride. The second layer is metal layers, such as tungsten, copper, aluminum, etc., which are used to connect the active devices.

In the case of CMP of metals, the chemical action is generally considered to take one of two forms. In the first mechanism, the chemicals in the solution react with the metal layer to continuously form an oxide layer on the surface of the metal. This generally requires the addition of an oxidizer to the solution such as hydrogen peroxide, ferric nitrate, etc. Then the mechanical abrasive action of the particles continuously and simultaneously removes this oxide layer. A judicious balance of these two processes obtains optimum results in terms of removal rate and polished surface quality.

In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal and enhancing the diffusion of reactants and products to and away from the surface by mixing and by reducing the thickness of the boundary layer.

The slurry composition is an important factor in the CMP step. Depending on the choice of the oxidizing agent, the abrasive, and other useful additives, the polishing slurry can be tailored to provide effective polishing of metal layers at desired polishing rates while minimizing surface imperfections, defects, corrosion, and erosion of oxide in areas with tungsten vias. Furthermore, the polishing slurry may be used to provide controlled polishing selectivities to other thin-film materials used in current integrated circuit technology such as titanium, titanium nitride and the like.

There is a significant need for metal CMP process(es) and slurry(s) that afford low dishing and plug recess effects especially in view of the fact that the semiconductor industry continues to move towards smaller and smaller feature sizes. The present invention provides a solution to this significant need.

BRIEF SUMMARY OF THE INVENTION

In an embodiment, the invention is a combination of a chemical mechanical polishing composition in contact with a substrate surface having at least one feature thereon comprising tungsten, said combination comprising:
 a) a substrate comprising submicron integrated circuits and having a surface having at least one feature thereon comprising tungsten, said substrate surface contacting a chemical mechanical polishing composition comprising;
 b) periodic acid; and
 c) an abrasive;
 wherein said periodic acid and said abrasive are present in a combined amount sufficient to render the substrate surface substantially planar and to maintain a removal rate of tungsten of at least 800 Angstroms per minute upon chemical-mechanical polishing thereof when polishing is done at 4 pounds per square inch (psi) of down force. In an embodiment, the surface of the substrate also has at least one feature thereon comprising a dielectric material.

In another embodiment, the invention is a method for chemical mechanical polishing of a surface having at least one feature thereon comprising tungsten, said method comprising the steps of:
 A) placing a substrate having the surface having the at least one feature thereon comprising tungsten in contact with a polishing pad;
 B) delivering a polishing composition comprising:
  a) an abrasive;
  b) periodic acid; and
 C) polishing the substrate with the polishing composition.

DETAILED DESCRIPTION OF THE INVENTION

This invention involves a combination, a slurry and an associated method for chemical mechanical planarization of a tungsten-containing substrate. The combination is that of a chemical mechanical polishing composition in contact with a substrate surface having at least one feature thereon comprising tungsten. Minimization or prevention of dishing/erosion and plug recess of features on semiconductor substrates during CMP processing is becoming increasingly more important as the semiconductor industry trends to smaller and smaller feature sizes in the manufacture of integrated circuits.

The tungsten CMP slurry composition and combination described herein satisfies the need for low selectivity of tungsten removal rates to dielectric removal rates. The general composition consists of an abrasive, periodic acid as oxidizer, and, in some embodiments, a chelator. By varying the ratio of abrasive to oxidizer, both removal rates and selectivity can be tuned to those desired for a specific application. Addition of an appropriate chelator provides for both pH adjustment and stability with regard to pH drift. The chelator also decreases cost of ownership by boosting tungsten removal rate and thereby reducing the amount of oxidizer needed for a given tungsten removal rate to be obtained.

In this invention, the oxidizer is periodic acid (PIA). The level of periodic acid in the slurry can range from about 0.1 weight percent to about 15 weight percent, and, for example can range from about 0.1 weight percent to about 5 weight percent. In an embodiment, the periodic acid ranges from about 0.2 weight percent to about 5 weight percent. In another embodiment, the periodic acid ranges from about 0.5 to about 2 weight percent.

Suitable abrasives for this invention include, but are not limited to, alumina, ceria, germania, silica, titania, zirconia, and mixtures thereof. In one embodiment, the abrasive is silica (colloidal silica or fumed silica). In an embodiment, the abrasive is colloidal silica. The abrasive level in the slurry can broadly range from about 0.1 weight percent to about 25 weight percent of the total weight of the slurry and, for example, can range from about 0.1 weight percent to about 15 weight percent. In an embodiment, the abrasive level ranges from about 2 weight percent to about 15 weight percent, and, in another embodiment, ranges from about 4 weight percent to about 14 weight percent, for example, from about 5 weight percent to about 13 weight percent. In a preferred embodiment, the abrasive level ranges from about 5 weight percent to about 13 weight percent.

In a preferred embodiment, the periodic acid level ranges from about 0.9 weight percent to about 2 weight percent in a slurry, where the abrasive level ranges from about 5 weight percent to about 13 weight percent. As shown in the examples, such a slurry has been found to possess low tungsten:dielectric (specifically W:TEOS) selectivity values which range from about 0.73 to about 1.12 that vary with the amount of periodic acid in relation to the amount of abrasive (e.g., colloidal silica).

In some embodiments, the composition and combination are further comprised of an amino-alcohol compound that serves a dual function of being a chelator as well as being a pH-adjusting agent that serves to increase pH of the resulting composition.

Furthermore, the amino-alcohol compound is also a stabilizer. The chelating function is beneficial in boosting metal removal rates during CMP processing and the basic properties of the amino-alcohol compound are useful in increasing pH values of periodic acid-based slurries, which are highly acidic. Raising slurry pH values from around 1-2 to 3 or higher is highly desirable commercially in reducing or eliminating potential corrosion and safety problems associated with such very low pH slurries. Surprisingly and unexpectedly, an amino-alcohol compound such as 2-(2-aminoethoxy) ethanol has been found to impart long slurry stability and lifetime with respect to pH drift when this component is present in a slurry. As shown in the examples, an inventive periodic acid-based slurry maintained virtually constant pH of ~3.5 over many months with 2-(2-aminoethoxy)ethanol being present in the slurry. In an embodiment, the amino-alcohol compound is selected from the group consisting of 2-(2-aminoethoxy)ethanol, 2-(2-aminoethylamino)ethanol, diethanolamine, ethanolamine, and triethanolamine. In an embodiment, the amino-alcohol compound is 2-(2-aminoethoxy)ethanol.

If present, the level of the amino-alcohol compound can range from about 0.1 weight percent to about 5 weight percent. In an embodiment, the level ranges from about 0.1 weight percent to about 2 weight percent, and, in another embodiment, the level ranges from about 0.1 weight percent to about 1 weight percent. In an embodiment, an amino-alcohol compound is present in the composition and combination and the pH ranges from about pH 1 to about pH 4. In another embodiment, an amino-alcohol compound is present in the composition and combination and the pH ranges from about pH 5 to about pH 10.

Other chemicals that may be added to the CMP slurry composition include, for example, surfactants, pH-adjusting agents, acids, corrosion inhibitors, fluorine-containing compounds, chelating agents, nitrogen-containing compounds, and salts.

Suitable surfactant compounds that may be added to the slurry composition include, for example, any of the numerous nonionic, anionic, cationic or amphoteric surfactants known to those skilled in the art. The surfactant compounds may be present in the slurry composition in a concentration of about 0 weight % to about 1 weight % and, when present, are preferably present in a concentration of about 0.001 weight % to about 0.1 weight % of the total weight of the slurry. The preferred types of surfactants are nonionic, anionic, or mixtures thereof and are most preferably present in a concentration of about 10 ppm to about 1000 ppm of the total weight of the slurry. A suitable nonionic surfactant is Surfynol® 104E, which is a 50:50 mixture by weight of 2,4,7,9-tetramethyl-5-decyn-4,7-diol and ethylene glycol (solvent), (Air Products and Chemicals, Inc., Allentown, Pa.). Suitable anionic surfactants include cetyl trimethylammonium bromide and ammonium lauryl sulfate.

An (initial or additional) pH-adjusting agent may be used to improve the stability of the polishing composition, to improve the safety in handling and use, or to meet the requirements of various regulations. Suitable pH-adjusting agents or additional pH-adjusting agents to lower the pH of the polishing composition of the present invention include, but are not limited to, hydrochloric acid, nitric acid, sulfuric acid, chloroacetic acid, tartaric acid, succinic acid, citric acid, malic acid, malonic acid, various fatty acids, various polycarboxylic acids and mixtures thereof. Suitable pH-adjusting agents or additional pH-adjusting agents to raise the pH of the polishing composition of the present invention include, but are not limited to, potassium hydroxide, sodium hydroxide, ammonium hydroxide, tetramethylammonium hydroxide, ethylenediamine, piperazine, polyethyleneimine, modified polyethyleneimines, and mixtures thereof.

Suitable acid compounds that may be added to the slurry composition include, but are not limited to, formic acid, acetic acid, propanoic acid, butanoic acid, pentanoic acid, hexanoic acid, heptanoic acid, octanoic acid, nonanoic acid, lactic acid, hydrochloric acid, nitric acid, phosphoric acid, sulfuric acid, hydrofluoric acid, malic acid, tartaric acid, gluconic acid, citric acid, phthalic acid, pyrocatechoic acid, pyrogallol carboxylic acid, gallic acid, tannic acid, and mixtures thereof. These acid compounds may be present in the slurry composition in a concentration of about 0 weight % to about 1 weight % of the total weight of the slurry.

Suitable (initial or additional) chelating agents that may be added to the slurry composition include, but are not limited to, ethylenediaminetetracetic acid (EDTA), N-hydroxyethylethylenediaminetriacetic acid (NHEDTA), nitrilotriacetic acid (NTA), diethylenetriaminepentacetic acid (DPTA), ethanoldiglycinate, tricine, 2,2'-bipyridyl, tartaric acid, glutamic acid, aspartic acid, glutamine, L-aspartic acid, L-tryptophan, L-asparagine, L-arginine and mixtures thereof. The chelating agents may be present in the slurry composition in a concentration of about 0 weight % to about 3 weight %, and are preferably present in a concentration of about 0.05 weight % to about 0.20 weight % of the total weight of the slurry Suitable nitrogen-containing compounds that may be added to the slurry composition include, but are not limited to, ammonium hydroxide, hydroxylamine, monoethanolamine, diethanolamine, triethanolamine, diethyleneglycolamine, N-hydroxylethylpiperazine, polyethyleneimine, modified polyethyleneimines, and mixtures thereof. Suitable nitrogen-containing compounds also include various amino acids. Suitable amino acids include, but are not limited to, alanine, arginine, asparagine, aspartic acid, cysteine, glutamic acid, glutamine, glycine, histidine, isoleucine, leucine, lysine, methionine, phenylalanine, proline, serine, threonine, tryptophan, tyrosine, and valine. In an embodiment, the amino acid is glycine. The nitrogen-containing compounds may be present in the slurry composition in a concentration of about 0 weight % to about 1 weight %, and are preferably present in a concentration of about 0.01 weight % to about 0.20 weight % of the total weight of the slurry.

Suitable salts that may be added to the slurry composition include, but are not limited to, ammonium persulfate, potassium persulfate, potassium sulfite, potassium carbonate, ammonium nitrate, potassium hydrogen phthalate, hydroxylamine sulfate, and mixtures thereof. The salts may be present in the slurry composition in a concentration of about 0 weight % to about 10 weight %, and are preferably present in a concentration of about 0 weight % to about 5 weight % of the total weight of the slurry. A preferred salt is ammonium nitrate and is most preferably present in a concentration of about 0 weight % to about 0.15 weight % of the total weight of the slurry.

Still other chemicals that can be added to the slurry compositions are biological agents such as bactericides, biocides and fungicides especially if the pH is around about 6 to 9. Suitable biocides, include, but are not limited to, 1,2-benzisothiazolin-3-one; 2(hydroxymethyl)amino ethanol; 1,3-dihydroxymethyl-5,5dimethylhydantoin; 1-hydroxymethyl-5,5-dimethylhydantion; 3-iodo-2-propynyl butylcarbamate;

glutaraldehyde; 1,2-dibromo-2,4-dicyanobutane; 5-chloro-2-methyl-4-isothiazoline-3-one; 2-methyl-4-isothiazolin-3-one; and mixtures thereof.

The slurry compositions and associated methods of this invention can have pH values that broadly range from about 1 to about 11 and preferably range from about 1.5 to about 5, such as from about 2 to about 4. In an embodiment, the pH ranges from about 2 to about 4; in another embodiment, the pH ranges from about 5 to about 10. In many applications of this invention, such as for tungsten CMP, a pH value in the range from about 2 to about 4 is preferred. Having a pH below 2 can raise concerns about safety and corrosion incidents occurring at these low pH values. Having a pH above about 4 for tungsten CMP can result in significantly reduced tungsten removal rates and may destabilize the colloidal silica.

Associated Method

The associated method of this invention entails use of the aforementioned composition (as disclosed supra) for chemical mechanical planarization of substrates comprised of metals and dielectric materials. In the methods, a substrate (e.g., a wafer) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate.

In the combination and associated method of the invention, a removal rate of tungsten of at least 800 Angstroms per minute is maintained upon chemical-mechanical polishing thereof when polishing is done at 4 psi of down force. Higher removal rates are attained when down force values greater than 4 psi are used. In an embodiment, the removal rate of tungsten is at least 1000 Angstroms per minute. In other embodiments, the removal rates of tungsten are at least 1200 Angstroms per minute, 1500 Angstroms per minute, and 2000 Angstroms per minute.

As indicated above, an embodiment of the invention is a combination of a chemical mechanical polishing composition in contact with a surface of a substrate having at least one feature thereon comprising tungsten. In an embodiment, the surface of the substrate also has at least one feature thereon comprising a dielectric material. In an embodiment, the dielectric material is a silicon oxide.

In embodiments of the combination and method according to the invention, a tunable tungsten/dielectric selectivity is realized upon chemical-mechanical polishing the substrate using the composition, which selectivity depends upon the amount of abrasive in relation to the amount of periodic acid. In embodiments of the combination and method according to the invention, the tungsten/dielectric selectivity ranges from about 0.5 to about 1.5 in one case, ranges from about 0.7 to about 1.3 in another case, and ranges from about 0.8 to about 1.2 in yet another case.

The present invention is further demonstrated by the examples below.

EXAMPLES

General

All percentages are weight percentages unless otherwise indicated.

CMP Methodology

In the examples presented below, CMP experiments were run using the procedures and experimental conditions given below.

Glossary

Components
Polishing Pad, Politex®, and IC1000 were used during CMP, supplied by Rohm & Haas, Inc.
Parameters
General
Å: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: slurry flow, ml/min
TEOS: tetraethylorthosilicate
wt. %: weight percentage (of a listed component).
W:TEOS Selectivity: removal rate of W/removal rate of TEOS.
Removal Rates:
Tungsten Removal Rates: Measured tungsten removal rate at 4.0 psi down pressure of the CMP tool.
CMP Methodology:
In the examples presented below, CMP experiments were run using the procedures and experimental conditions given below.
Metrology:
Tungsten films were measured with a ResMap CDE, model 168, manufactured by Creative Design Engineering, Inc, 20565 Alves Dr., Cupertino, Calif., 95014. The ResMap tool is a four point probe sheet resistance tool. Forty nine point diameter scan at 5 mm edge exclusion for Tungsten film was taken.
CMP Tool:
The CMP tool that was used is a Mirra, manufactured by Applied Materials, 3050 Boweres Avenue, Santa Clara, Calif., 95054. A IC1000, kgroove stacked on a suba IV pad supplied by Rohm & Haas, Inc, 451 Bellevue Rd., Newark, Del. 19713, was used on platen 1 for blanket and pattern wafer studies. On Platen 3 a Politex pad, supplied by Rohm & Haas was used for the TEOS defect wafers after polishing on platen 1.

The IC1000 pad was broken in by conditioning the pad for 18 minutes at 7 lbs down-force on the conditioner. The Politex pad was broken in by polishing twenty TEOS dummy wafers with De-ionized water. In order to qualify the tool settings and the pad break-in two Tungsten monitors and two TEOS monitors were polished with Microplanar® CMP3850, supplied by DuPont Air Products NanoMaterials L.L.C. at baseline conditions.

In blanket wafer studies, tungsten blanket wafers were polished at baseline conditions. The tool baseline conditions were: table speed; 120 rpm, head speed: 123 rpm, membrane pressure; 4.0 psi, inter-tube pressure; 5.0 psi, retaining ring pressure; 6.5 psi, slurry flow; 150 ml/min.

Wafers:

Polishing experiments were conducted using CVD deposited Tungsten wafers. These blanket wafers were purchased from Silicon Valley Microelectronics, 2985 Kifer Rd., Santa Clara, Calif. 95051. The film thickness specifications are summarized below: W: 8,000 Å CVD tungsten, 240 Å TiN, 5000 Å TEOS on silicon.

Examples 1-12

Slurry samples of batch size 3 kg were made having the weight percent compositions as shown in Table 1 (with water being a third component that is the balance of the composition in each case). The samples each contained colloidal silica, periodic acid, and deionized water. The colloidal silica was MicroPlanar® CMP3850 supplied by DuPont Air Products NanoMaterials, L.L.C., 2441 W. Erie Dr., Tempe, Ariz. 85282 and had a pH of ~3 as supplied. The periodic acid was also obtained from DuPont Air Products NanoMaterials, L.L.C.

CMP experiments were conducted using tungsten and TEOS blanket wafers on the Mirra tool with the following conditions being used for all samples: down-force of 4.0 psi, slurry flow rate of 150cc/min, and table rotational speed of 120 rpm. Removal rates for both tungsten and TEOS were measured at 4 psi down-force for the polishing tool. These are reported in Table 1 and were used to calculate the W:TEOS selectivity values reported in Table 1.

The compositions and results obtained for samples 1-12 (corresponding to Examples 1-12) are summarized in Table 1. The results obtained demonstrate that these slurries are tunable with respect to tungsten/TEOS selectivity by variation of the ratio of the amount of colloidal silica to the amount of periodic acid. The W:TEOS selectivity increases with increasing periodic acid level and decreasing colloidal silica level.

TABLE 1

Examples of Low-selective Tungsten Formulations: Tunability of W:TEOS Selectivity

| Sample Composition#/ Properties | Example 1 | Example 2 | Example 3 | Example 4 |
|---|---|---|---|---|
| Colloidal Silica (wt %) | 13 | 9 | 5 | 11 |
| PIA (wt %) | 0.5 | 0.5 | 0.5 | 0.9 |
| pH before PIA | 2.99 | 3.17 | 3.38 | 3.07 |
| pH after PIA | 1.92 | 1.97 | 1.97 | 1.79 |
| Removal rates* of W at 4 psi, 60 sec | 1114 | 1017 | 883 | 1379 |
| Removal rates* of TEOS at 4 psi, 60 sec | 2081 | 1619 | 1274 | 1894 |
| W:TEOS Selectivity | 0.54 | 0.63 | 0.69 | 0.73 |

| | Example 5 | Example 6 | Example 7 | Example 8 |
|---|---|---|---|---|
| Colloidal Silica (wt %) | 13 | 7 | 11 | 13 |
| PIA (wt %) | 1.25 | 0.9 | 1.6 | 2 |
| pH before PIA | 2.93 | 3.32 | 2.95 | 2.87 |
| pH after PIA | 1.73 | 1.74 | 1.61 | 1.58 |
| Removal rates* of W at 4 psi, 60 sec | 1692 | 1341 | 1745 | 2115 |
| Removal rates* of TEOS at 4 psi, 60 sec | 2162 | 1484 | 1925 | 2174 |
| W:TEOS Selectivity | 0.78 | 0.90 | 0.91 | 0.97 |

| | Example 9 | Example 10 | Example 11 | Example 12 |
|---|---|---|---|---|
| Colloidal Silica (wt %) | 7 | 9 | 5 | 5 |
| PIA (wt %) | 1.6 | 2 | 1.25 | 2 |
| pH before PIA | 3.16 | 3.07 | NA | 3.31 |
| pH after PIA | 1.61 | 1.63 | 1.73 | 1.60 |
| Removal rates* of W at 4 psi, 60 sec | 1635 | 1861 | 1475 | 1712 |
| Removal rates* of TEOS at 4 psi, 60 sec | 1526 | 1718 | 1320 | 1321 |
| W:TEOS Selectivity | 1.07 | 1.08 | 1.12 | 1.30 |

*All removal rates reported are in units of angstroms/minute of polishing time.
Water is the balance for each composition in this table.

Example 13

A slurry of batch size 3 kg was made up that contained 10 weight percent colloidal silica, 1.11 weight percent of periodic acid, and water (balance of this composition). This slurry was used in polishing experiments on patterned wafers of different arrays (as reported in Table 2). Erosion values incurred during polishing of the different wafers measured at center, middle, and edge die positions were determined as reported in Table 2 for three different levels of over-polish (OP): (15%, 30%, and 60%). The results demonstrated that there was little change in the extent of erosion incurred during polishing with use of this slurry at increasing levels of over-polish up to 60%, which is highly desirable.

TABLE 2

Examples of Low-selective Tungsten Formulations: Erosion vs. overpolish

| | Example 13 15% OP | Example 13 30% OP | Example 13 60% OP |
|---|---|---|---|
| Colloidal Silica (wt %) | 10 | 10 | 10 |
| PIA (wt %) | 1.11 | 1.11 | 1.11 |
| Erosion at 2 × 3 arrays (0.24 um contact space within array, 0.16 um contact) | | | |
| Center die | 47 | 57 | 75 |
| Middle die | 21 | 47 | 79 |
| Edge die | 23 | 50 | 75 |
| Erosion at 3 × 3 arrays (0.20 um contact space within array, 0.16 um contact) | | | |
| Center die | 43 | 89 | 75 |
| Middle die | 26 | 57 | 78 |
| Edge die | 37 | 57 | 92 |
| Erosion at 3 × 3 arrays (0.16 um contact space within the array, 0.16 um contact) | | | |
| Center die | 38 | 66 | 75 |
| Middle die | 43 | 81 | 78 |
| Edge die | 40 | 61 | 110 |
| Erosion at 0.15 μm contact array, 5.1% density | | | |
| Center die | 14 | 29 | 49 |
| Middle die | 11 | 31 | 40 |
| Edge die | 10 | 23 | 37 |

Examples 14 AND 15

In these examples, the effect of 2-(2-aminoethoxy)ethanol as both a chelator and pH adjustor was demonstrated. Two samples were made as shown in Table 3 with both containing PIA at 1.25 weight percent and colloidal silica at 9 weight percent. The sample for Example 14 did not contain any 2-(2-aminoethoxy)ethanol, while the sample for Example 15 contained this component at a level of 0.582 weight percent. The comparative results obtained are shown in Table 3 and are dramatic in that having this chelator/pH adjustor present boosted the tungsten removal rate significantly, while also raising the final pH nearly 2 pH units to approximately 3.5 (which pH value is highly desirable over the lower pH of Example 14 of 1.59 with respect to corrosion and safety concerns at the lower pH).

TABLE 3

Examples of Low-selective Tungsten Formulations: Effect of Chelator

|  | Example 14 | Example 15 |
|---|---|---|
| Colloidal Silica (wt %) | 9 | 9 |
| 2-(2-aminoethoxy)ethanol | 0 | 0.582 |
| PIA (wt %) | 1.25 | 1.25 |
| pH before PIA | 3.04 | 10.45 |
| pH after PIA | 1.59 | 3.48 |
| Removal rates* of W at 4 psi, 60 sec | 1587 | 2120 |
| Removal rates* of TEOS at 4 psi, 60 sec | 1714 | 1601 |
| W:TEOS Selectivity | 0.93 | 1.32 |

*All removal rates reported are in units of angstoms/minute of polishing time.

Examples 16-18

In these examples, two PIA/colloidal silica slurries were prepared with and without 2-(2-aminoethoxy)ethanol being present, as shown in Table 4. Example 16 did not contain this component, while Example 17 did contain this component. Also in Example 18 a PIA/colloidal silica slurry was prepared using ammonium hydroxide in place of 2-(2-aminoethoxy)ethanol. The pH of these slurries was monitored over 7 months, as shown in Table 4. The results demonstrated essentially a constant pH was maintained in the Example 17 slurry containing 2-(2-aminoethoxy)ethanol as pH adjustor/chelator as well as in the Example 16 slurry without this additive. In sharp contrast, significant pH variations were found to occur in the Example 18 slurry having ammonium hydroxide in place of 2-(2-aminoethoxy)ethanol. Similar results to the Example 18 slurry were obtained using potassium hydroxide in place of ammonium hydroxide.

TABLE 4 pH Stability Data[a]: Effect of Chelator

| | Time | | | | |
|---|---|---|---|---|---|
| | 0 month | 1 month | 2 months | 3 months | 7 months |
| Example 16 | 1.68 | 1.67 | 1.72 | 1.71 | 1.79 |
| Example 17 | 3.48 | 3.62 | 3.70 | 3.74 | 3.59 |
| Example 18 (Comparative) | 6.14 | 2.51 | monitoring discontinued due to high shift in pH | | |

[a]Table shows pH value of each sample measured soon after preparation (0 month), 1 month, 2 months, 3 months, and 7 months after preparation of the sample.

The invention claimed is:

1. A method for chemical mechanical polishing of a surface having at least one feature thereon comprising tungsten and at least one feature thereon comprising a dielectric material, said method comprising the steps of:
   a. placing a substrate having the surface in contact with a polishing pad;
   b. delivering a polishing composition comprising:
      an abrasive;
      periodic acid; and
      an amino alcohol compound; and
   c. polishing the substrate with the polishing composition wherein
      said periodic acid and said abrasive are present in a combined amount sufficient to render the substrate surface substantially planar and to maintain a removal rate of tungsten of at least 800 Angstroms per minute upon chemical-mechanical polishing thereof when polishing is done at 4 psi of down force ; and
      a tunable tungsten/dielectric selectivity ranging from 0.5 to 1.5 is realized upon chemical-mechanical polishing the substrate using the composition.

2. The method of claim 1, wherein the dielectric material is a silicon oxide.

3. The method of claim 1, wherein the amino-alcohol compound is selected from the group consisting of 2-(2-aminoethoxy)ethanol, 2-(2-aminoethylamino)ethanol, diethanolamine, ethanolamine, triethanolamine and mixtures thereof.

4. The method of claim 3, wherein the amino-alcohol compound is 2-(2-aminoethoxy)ethanol.

5. The method of claim 1, further comprising a pH-adjusting agent, wherein the composition has a pH ranging from pH 1 to pH 4.

6. The method of claim 1, wherein the periodic acid is present in an amount from 0.1 weight percent to 5 weight percent.

7. The method of claim 1, wherein the abrasive is present in an amount from 0.1 to 15 weight percent.

8. The method of claim 1, wherein the tunable tungsten/dielectric selectivity depends upon the amount of abrasive in relation to the amount of periodic acid.

* * * * *